(12) United States Patent
Carreau et al.

(10) Patent No.: US 7,167,121 B2
(45) Date of Patent: Jan. 23, 2007

(54) METHOD AND APPARATUS FOR SPLIT REFERENCE SAMPLING

(75) Inventors: Gary Carreau, Plaistow, NH (US); Bruce Amazeen, Ipswich, MA (US)

(73) Assignee: Analog Devices, Inc., Norwood, MA (US)

( * ) Notice: Subject to any disclaimer, the term of this patent is extended or adjusted under 35 U.S.C. 154(b) by 427 days.

(21) Appl. No.: 10/272,045

(22) Filed: Oct. 16, 2002

(65) Prior Publication Data

US 2004/0075601 A1   Apr. 22, 2004

(51) Int. Cl.
*H03M 1/66* (2006.01)

(52) U.S. Cl. .................. 341/150; 341/155; 341/172

(58) Field of Classification Search ........... 341/150, 341/172, 143, 120
See application file for complete search history.

(56) References Cited

U.S. PATENT DOCUMENTS

| | | | |
|---|---|---|---|
| 4,578,772 A | 3/1986 | Fujii | |
| 4,851,846 A * | 7/1989 | Haulin | ........................ 341/172 |
| 5,323,158 A | 6/1994 | Ferguson, Jr. | |
| 5,412,387 A | 5/1995 | Vincelette et al. | |
| 5,424,670 A | 6/1995 | Samuels et al. | |
| 5,451,950 A | 9/1995 | Vincelette et al. | |
| 5,453,710 A | 9/1995 | Gilbert et al. | |
| 5,479,130 A | 12/1995 | McCartney | |
| 5,495,200 A | 2/1996 | Kwan et al. | |
| 5,563,597 A | 10/1996 | McCartney | |
| 5,739,720 A | 4/1998 | Lee | |
| 5,872,469 A | 2/1999 | Nestler | |
| 6,037,887 A * | 3/2000 | Wu et al. | .................... 341/143 |
| 6,040,793 A | 3/2000 | Ferguson, Jr. et al. | |
| 6,054,945 A | 4/2000 | Doyle | |
| 6,707,403 B1 * | 3/2004 | Hurrell | ...................... 341/120 |

FOREIGN PATENT DOCUMENTS

| | | |
|---|---|---|
| EP | 0899884 A2 | 3/1999 |
| EP | 1039642 A1 | 9/2000 |

OTHER PUBLICATIONS

Ueno et al. (PGPUB 2001/0033240), "Delta sigma ADC", filed Oct. 25, 2001.*

* cited by examiner

*Primary Examiner*—Jean Bruner Jeanglaude
(74) *Attorney, Agent, or Firm*—Wolf, Greenfield & Sacks, P.C.

(57) ABSTRACT

A switched-capacitor circuit for use in analog-to-digital conversion samples an input signal with respect to a reference voltage, without having to generate the reference voltage, by using charge redistribution. The switched-capacitor circuit prevents the need to dissipate power while producing the reference voltage. The switched-capacitor circuit is coupled to a comparator and to a logic circuit which provides control signals for switching. The switched-capacitor circuit comprises a plurality of capacitors arranged according to several embodiments.

51 Claims, 12 Drawing Sheets

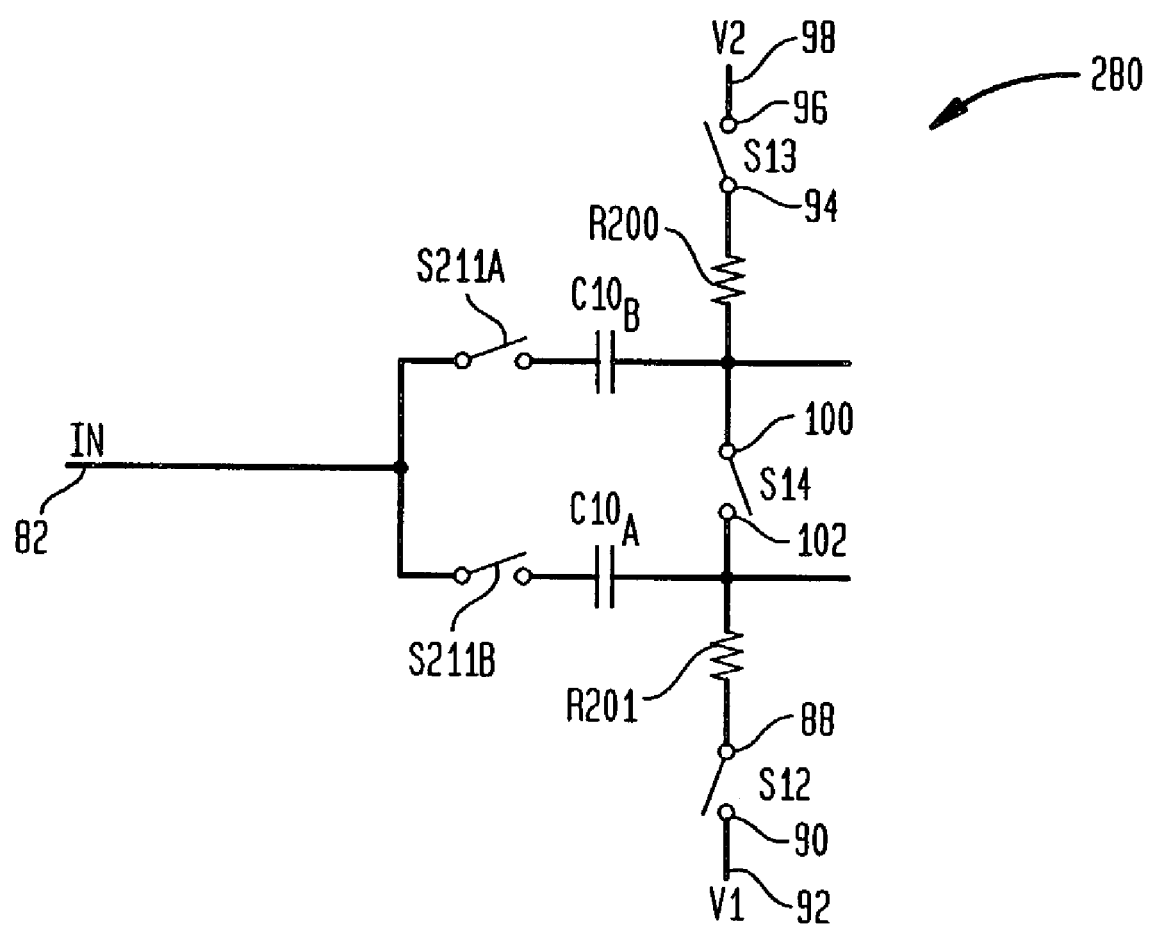

METHOD AND APPARATUS FOR SPLIT REFERENCE SAMPLING

TECHNICAL FIELD

This invention relates to switched-capacitor methods and apparatus, and more particularly, to switched-capacitor methods and apparatus used for sampling and/or processing of signals.

RELATED ART

Many systems employ switched-capacitor circuits (which make use of capacitors and switches) for sampling and/or processing of signals. For example, analog to digital converters (ADCs) often employ a switched-capacitor circuit to sample an analog voltage prior to analog to digital conversion.

FIG. 1 is a block diagram of a prior art ADC 20 that employs a switched-capacitor circuit to sample an analog voltage prior to analog to digital conversion. The ADC 20 includes a switched-capacitor circuit 22, a comparator circuit 24 (referred to hereafter as comparator 24) and a control/output circuit 26 (referred to hereafter as control circuit 26). The switched-capacitor circuit 22 receives a differential input voltage, IN+, IN− (which is supplied via signal lines 28, 30, respectively) and outputs a differential output voltage CP, CN. The differential output voltage CP, CN is supplied on signal lines 32, 34, respectively, to the comparator 24, which is further supplied with supply voltages, VDD and VSS. The output of the comparator 24 is supplied via a signal line 36 to the control circuit 26, which provides control signals (represented by CONTROL) that are supplied on signal lines (represented by a signal line 38) provided to the switched-capacitor circuit 22. The control circuit 26 also provides a multi-bit digital signal, DOUT, which is the output of the ADC 20. The DOUT signal indicates a ratio of the magnitude of the differential input signal, IN+, IN−, compared to the magnitude of a differential reference voltage, REF+, REF−, which is supplied on signal lines 40, 42.

FIG. 2 is a schematic diagram of a prior art switched-capacitor circuit 22. For clarity, it has been assumed that the ADC 20 is a 4-bit ADC. The comparator 24 is shown in phantom. The switched-capacitor circuit 22 is made up of two circuit portions 50, 52. The first portion 50 includes capacitors C1–C4x and switches S1–S4x, S9. The capacitors C1–C4 have binary-weighted capacitance values C/2, C/4, C/8, C/16, respectively. Capacitor C4x has the same capacitance as C4, namely C/16, so that the sum capacitance of C2–C4x equals the capacitance of C1. The second portion 52 includes capacitors C5–C8x and switches S5–S8x, S10 The capacitors C5–C8 have binary-weighted capacitance values C/2, C/4, C/8, C/16, respectively. Capacitor C8x has the same capacitance as C8, namely C/16, so that the sum capacitance of C6–C8x equals the capacitance of C5. Capacitors C1, C5 are associated with the MSB of the ADC 20. Capacitors C4, C8 are associated with the LSB of the ADC 20. The switches S1–S10 in the switched-capacitor circuit 22 are controlled by the control signals, CONTROL, supplied from the control circuit 26.

FIG. 3 shows timing signals employed within the control circuit 26. Each of the timing signals has two logic states represented by first and second voltage levels. The timing signals are shown on the same time axis however this does not signify that one attains different voltage levels than the others.

The operation of the ADC 20 is as follows. During a sampling interval (FIG. 3), the switch S9 is commanded to a closed state and switches S1–S4x are commanded to a state that connects each of the capacitors C1–C4x, respectively, to the voltage IN+, thereby allowing the voltage IN+ to be sampled (with respect to voltage CM) in each of the capacitors C1–C4x. In addition, switch S10 is in a closed state and switches S5–S8x are in a state that connects each of the capacitors C5–C8x, respectively, to the voltage IN−, thereby allowing the voltage IN− to be sampled (with respect to voltage CM) in each of the capacitors C5–C8x. At the end of the sampling interval (FIG. 3), the switches S9, S10 are opened, thereby disconnecting the capacitors C1–C4x, C5–C8x from voltage CM. A conversion interval (FIG. 3) follows the sampling interval (FIG. 3). During the conversion interval (FIG. 3), the control circuit 26 commands switches S1–S4x, S5–S8x to various states in accordance with a conversion algorithm, and monitors the resulting output signals from the comparator 24. Note that the conversion interval and the sampling interval do not overlap one another in time. Finally, during an output interval, the control circuit 26 provides a multi-bit digital output signal DOUT based on output signals received from the comparator 24 during the conversion interval (FIG. 3). This type of ADC is commonly referred to as a successive approximation ADC.

In charge redistribution converters, it is necessary to prevent the output voltage CP, CN from going beyond the supply range (i.e, >VDD or <VSS), and in order to simplify the design of the comparator 24, it is desirable to ensure that the common mode voltage of CP and CN is within the common mode range of the comparator during the conversion interval. One way to achieve this is by making the magnitude of the voltage CM equal to ½ (VDD+VSS), so that the differential input voltage IN+, IN− is sampled with respect to ½ (VDD+VSS). Such a voltage is often readily available, i.e., voltage REF+ is often approximately equal to ½ (VDD+VSS). However, this is not always the case. For example, in some instances, REF+ has a magnitude close or equal to VDD, which is beneficial for improving the signal to noise ratio of the ADC, but makes REF+ unsuitable for use as voltage CM.

Consequently, additional circuitry is often used to generate a voltage equal to ½ (VDD+VSS).

FIG. 4 is a schematic block diagram of a switched-capacitor circuit 62 that includes circuitry to generate a voltage equal to ½ (VDD+VSS). As in FIG. 2, the comparator 24 is shown in phantom. The switched-capacitor circuit 62 is identical to the switched-capacitor circuit 22 (FIG. 1) except for the addition of two resistors R1, R2, which are connected in series between the supply voltages VDD, VSS. Resistors R1 and R2 each have a resistance value R whereby the magnitude of the voltage generated at the center tap is equal to ½ (VDD+VSS). Additionally, it has been taught to use other voltages such as IN+, IN− or REF+, REF− instead of VDD, VSS, and to adjust the resistances of R1 and R2 to achieve the desired voltage on the center tap. One disadvantage of this circuit 62 is that the resistor string R1, R2 dissipates a significant amount of power.

Notwithstanding the performance provided by the prior art switched-capacitor circuits described above, other switched-capacitor circuits for sampling and/or processing input signal(s) are sought.

SUMMARY OF THE INVENTION

In accordance with one aspect of the present invention, a system comprises a switched-capacitor circuit including a first capacitor, a second capacitor and at least one switch, the at least one switch being operable during a first time interval to: (1) connect the first capacitor between a first signal line having a first voltage and a second signal line having a second voltage, and (2) connect the second capacitor between the first signal line having the first voltage and a third signal line having a third voltage, the third voltage being different than the second voltage, and the at least one switch being operable during a second time interval to connect the first capacitor in parallel with the second capacitor.

In accordance with another aspect of the present invention, a system comprises a switched-capacitor circuit having a plurality of banks of capacitors and at least one switch, each of the plurality of banks of capacitors having a first capacitor and a second capacitor, the at least one switch being operable during a first time interval to: (1) connect the first capacitor of each bank between a first signal line having a first voltage and a second signal line having a second voltage, and (2) connect the second capacitor of each bank between the first signal line having the first voltage and a third signal line having a third voltage, the third voltage being different than the second voltage, and the at least one switch being operable during a second time interval to connect the first capacitor of each bank in parallel with the second capacitor of such bank.

In accordance with another aspect of the present invention, a system comprises a switched-capacitor circuit having a first group of capacitors, a second group of capacitors, and at least one switch, the first group of capacitors having at least one capacitor, the second group of capacitors having at least one capacitor, the at least one switch being operable during a first time interval to: (1) connect each capacitor of the first group of capacitors between a first signal line having a first voltage and a second signal line having a second voltage, and (2) connect each capacitor of the second group of capacitors between the first signal line having the first voltage and a third signal line having a third voltage, the third voltage being different than the second voltage, and the at least one switch being operable during a second time interval to connect each capacitor of the first group of capacitors in parallel with each capacitor of the second group of capacitors.

In accordance with another aspect of the present invention, a method comprises connecting, during a first time interval, a first capacitor between a first signal line having a first voltage and a second signal line having a second voltage, a second capacitor between the first signal line and a third signal line having a third voltage, the third voltage being different than the second voltage; and connecting, during a second time interval, the first capacitor in parallel with the second capacitor.

In accordance with another aspect of the present invention, a system comprises means for connecting, during a first interval, a first capacitor between a first signal line having a first voltage and a second signal line having a second voltage, and for connecting, during the first interval, a second capacitor between the first signal line having the first voltage and a third signal line having a third voltage, the third voltage being different than the second voltage; and means for connecting, during a second interval, the first capacitor in parallel with the second capacitor.

In accordance with another aspect of the present invention, a system comprises a switched-capacitor circuit having a first group of capacitors, a second group of capacitors, and at least one switch, the first group of capacitors having at least one capacitor, the second group of capacitors having at least one capacitor, the at least one switch being operable during a first time interval to: (1) connect at least one capacitor of the first group of capacitors between a first signal line having a first voltage and a second signal line having a second voltage, and (2) connect at least one capacitor of the second group of capacitors between the first signal line having the first voltage and a third signal line having a third voltage, the third voltage being different than the second voltage, and the at least one switch being operable during a second time interval to connect the at least one capacitor of the first group to the at least one capacitor of the second group such that the voltage across the at least one capacitor of the first group and the voltage across the at least one capacitor of the second group become equal to one another.

BRIEF DESCRIPTION OF THE DRAWINGS

FIG. 13 is a schematic diagram of a switched-capacitor circuit in accordance with one embodiment of the present invention;

DETAILED DESCRIPTION

Figure 5:
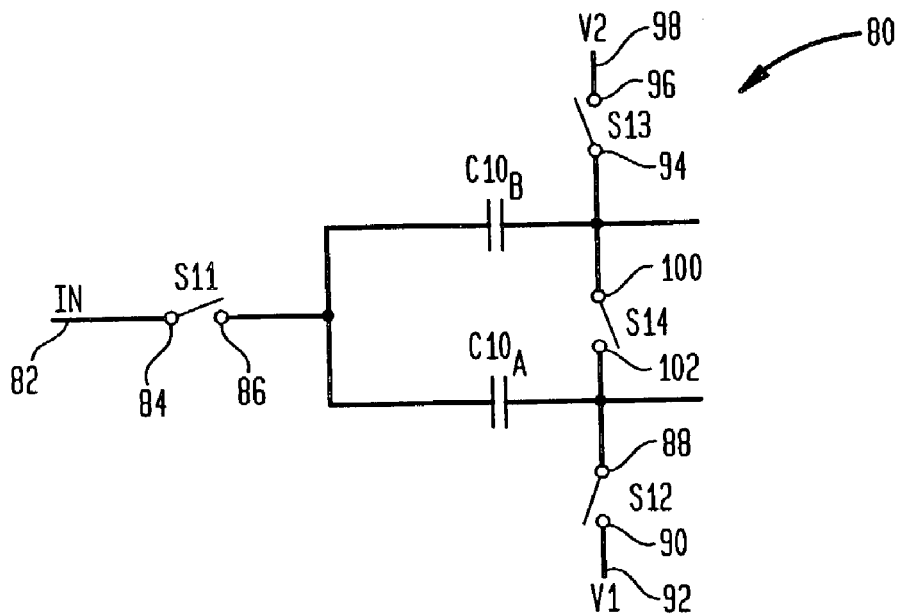
FIG. 5 is a schematic diagram of a switched-capacitor circuit in accordance with one embodiment of the present invention.

FIG. 5 is a schematic diagram of a switched-capacitor circuit 80 in accordance with one embodiment of the present invention. The switched-capacitor sampling circuit 80 includes capacitors C10A, C10B and switches S11–S14. A voltage IN is supplied on a terminal 82 connected to a first terminal 84 of switch S11. A second terminal 86 of switch S11 is connected to a first plate of capacitor C10A and to a first plate of capacitor C10B. A second plate of capacitor C10A is coupled to a first terminal 88 of switch S12, a second terminal 90 of which is coupled to a terminal 92 that supplies a voltage V1. A second plate of capacitor C10B is coupled to a first terminal 94 of switch S13, a second terminal 96 of which is coupled to a terminal 98 that supplies a voltage V2 (not equal to V1). Switch S14 has first and second terminals, 100, 102, the first terminal 100 being coupled to the second plate of capacitor C10B, the second terminal 102 being coupled to the second plate of capacitor C10B.

Figure 6:
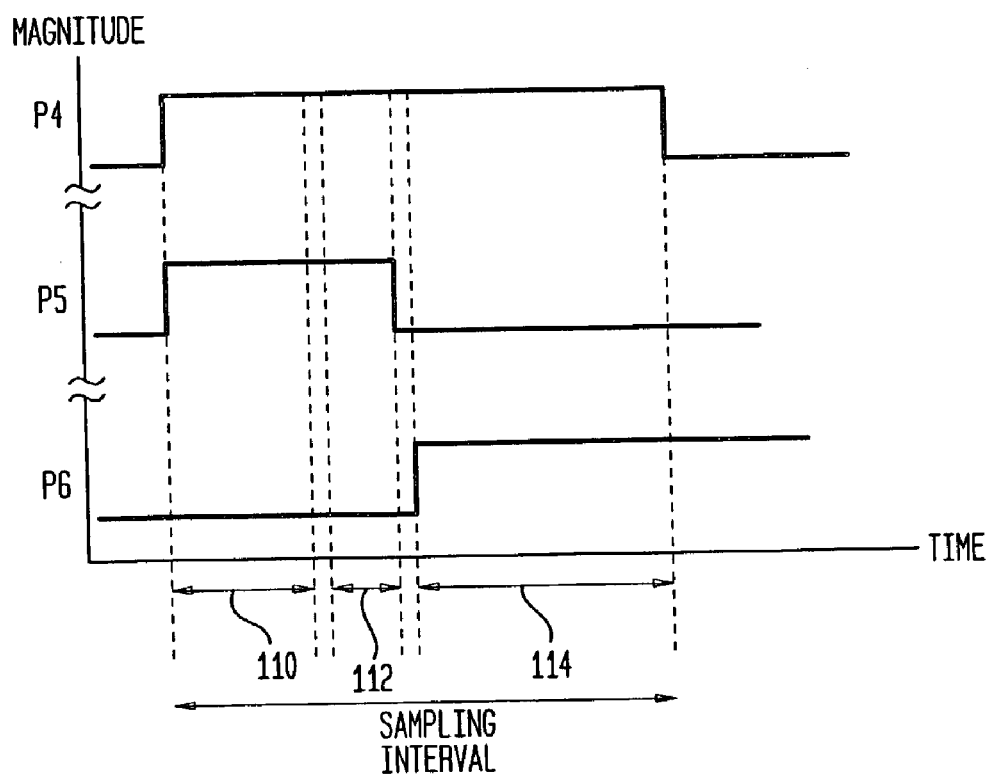
FIG. 6 illustrates timing signals used in the control of the switched-capacitor circuit of FIG. 5.

In this embodiment, the switches S11–S14 comprise "voltage shorting" type switches that are controlled by timing signals P4–P6 shown in FIG. 6. Each of the timing signals P4–P6 has two logic states represented by first and second voltage levels. The timing signals P4–P6 are shown on the same time axis. This does not, however, signify that one attains different voltage levels than the others.

The operation of the switched-capacitor circuit 80 is as follows. During a first portion 110 of a sampling interval (FIG. 6), switch S11 is commanded to a closed state to connect the first plate of each of the capacitors C10A, C10B to the terminal supplying the input voltage IN. Also, switches S12, S13 are commanded to a closed state to thereby connect the second plate of the capacitors C10A, C10B, to the terminals supplying V1 and V2, respectively. In this configuration, voltage IN is sampled (with respect to V1) in capacitor C10A and sampled (with respect to V2) in capacitor C10B.

During a second portion 112 of the sampling interval (FIG. 6), switches S12, S13 are commanded to an open state, thereby disconnecting the second plate of the capacitors C10A, C10B from the terminals supplying V1 and V2, respectively.

During a third portion 114 of the sampling interval (FIG. 6), switch S14 is commanded to a closed state, thereby connecting the second plate of capacitor C10A to the second plate of capacitor C10B. Doing so puts capacitor C10A and C10B in parallel with one another.

If capacitors C10A, C10B each have a capacitance value of C/2, then in this state, the second plate of each of capacitors C10A, C10B has a voltage of ½ (V1+V2) and the amount of charge stored by each of the capacitors C10A, C10B is equal to that which would have been stored by the capacitors C10A, C10B had the voltage IN been sampled with respect to ½ (V1+V2).

Figure 1:
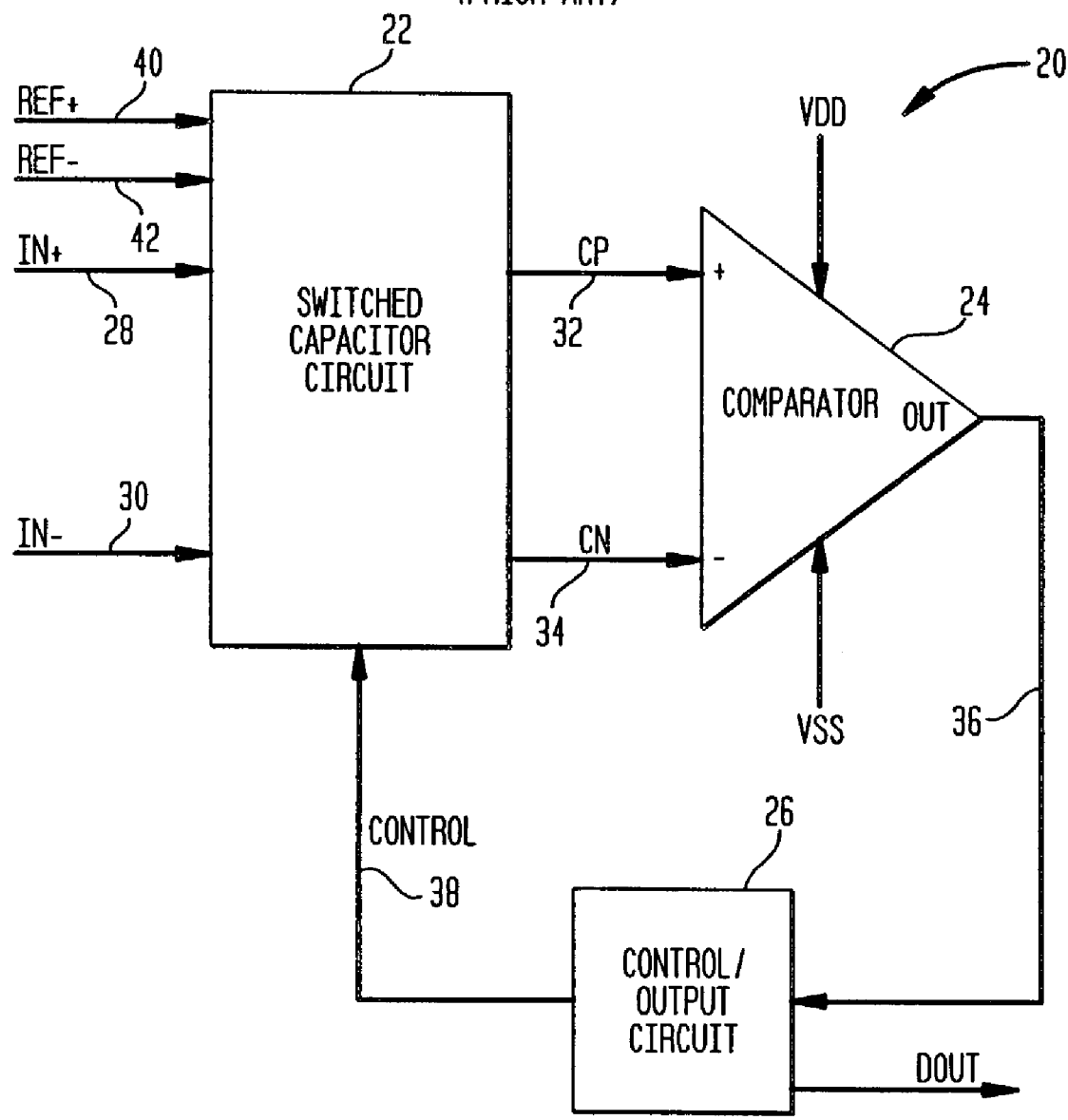
FIG. 1 is a schematic block diagram of a prior art analog to digital converter (ADC) that includes a switched-capacitor circuit.
Figure 2:
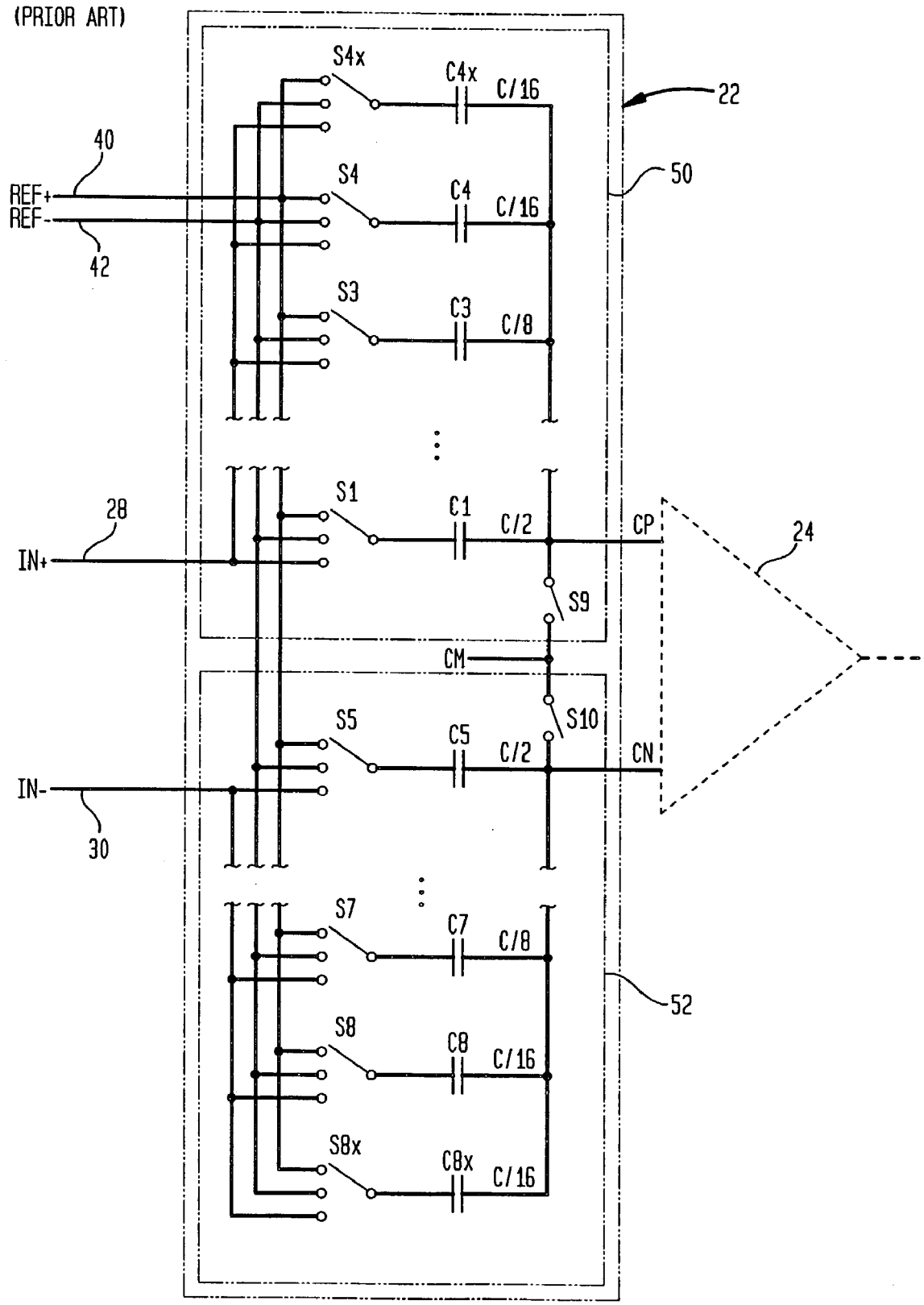
FIG. 2 is a schematic diagram of the switched-capacitor circuit of FIG. 1.
Figure 3:
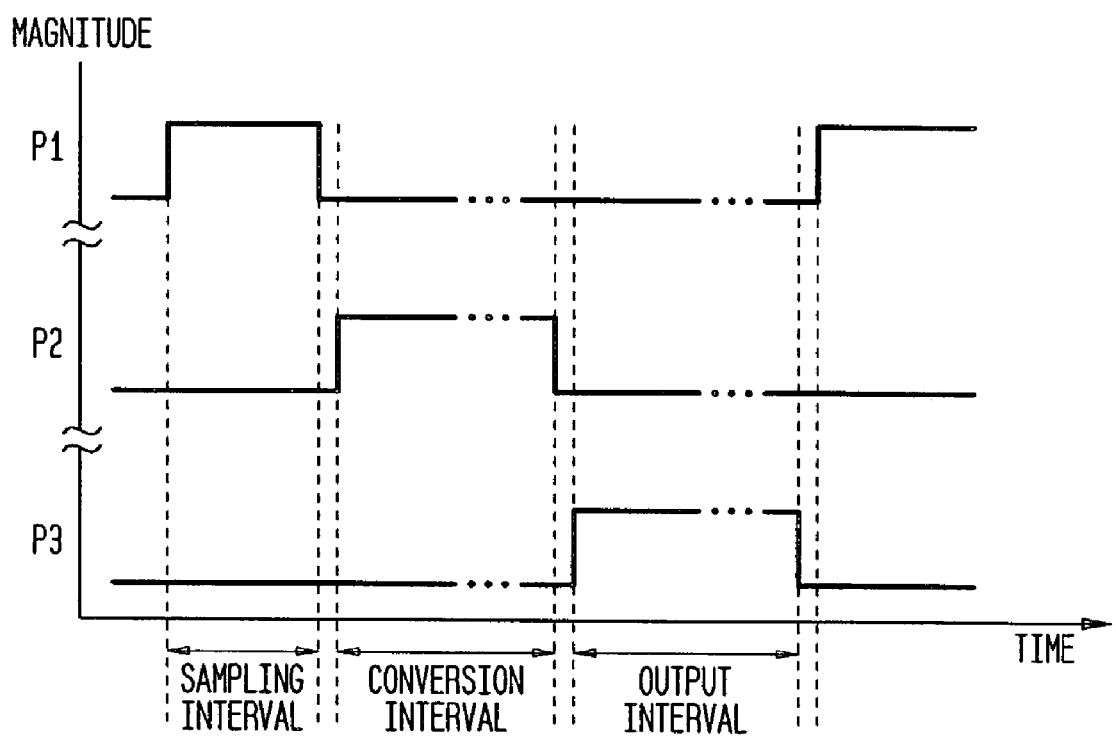
FIG. 3 illustrates timing signals used in the control circuit of FIG. 1.
Figure 4:
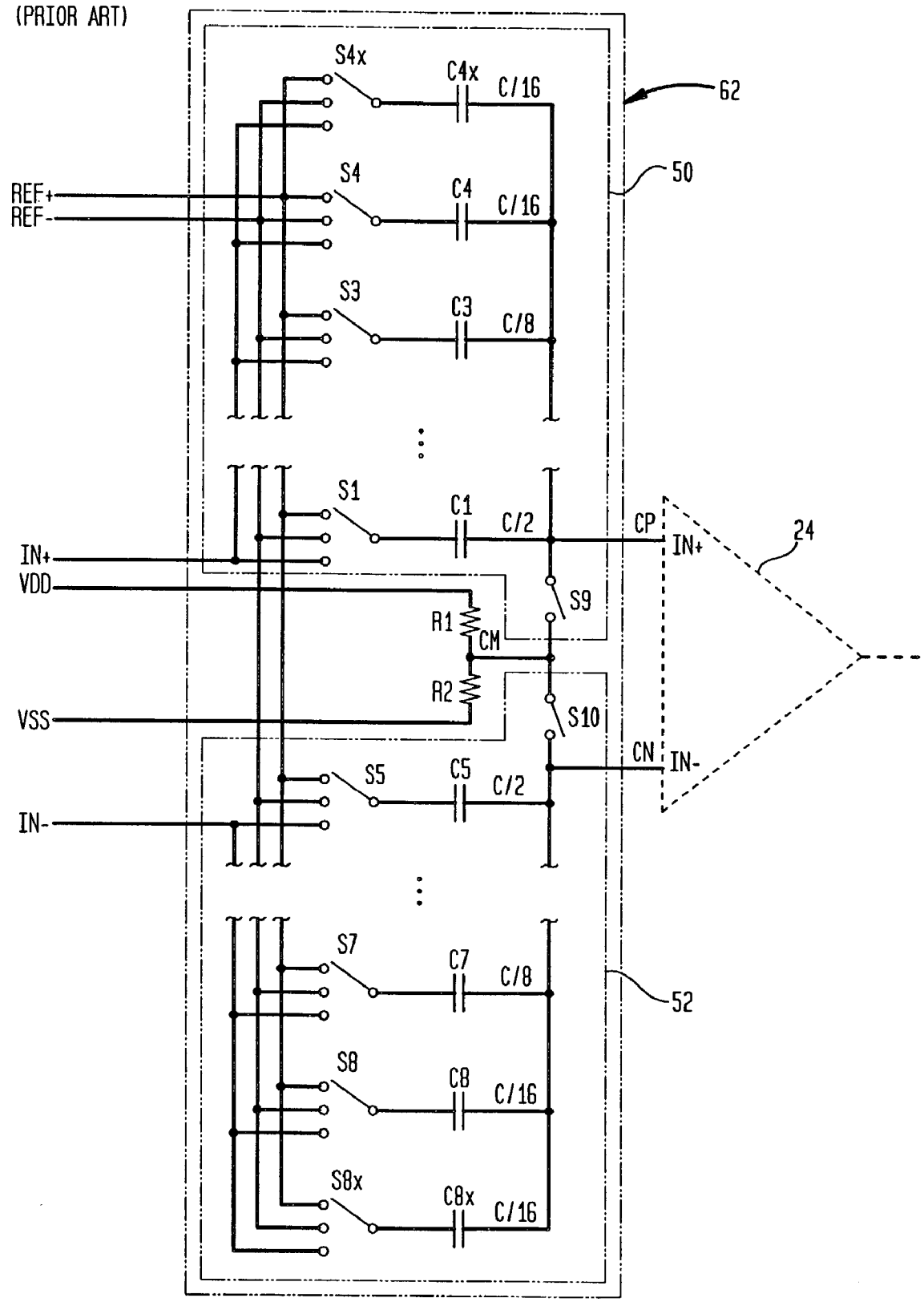
FIG. 4 is a schematic diagram of another prior art switched-capacitor circuit.

Accordingly, if V1, V2 are equal to VSS, VDD, respectively, then the voltage on the second plate of each of capacitors C10A, C10B is equal to ½ (VDD+VSS) and the amount of charge stored by each of the capacitors C10A, C10B is equal to that which would have been stored by the capacitors C10A, C10B had the voltage IN been sampled with respect to ½ (VDD+VSS). This result is similar to that obtained by the prior art switched-capacitor circuits 22 (FIG. 2), 62 (FIG. 4), which helps prevent the magnitude of the voltages CP, CN from going beyond a supply range (e.g., >VDD or <VSS), yet there is no need to provide the switched-capacitor circuit 80 with a voltage equal to ½ (VDD+VSS).

In some embodiments, switch S12 comprises an NMOS device, switch S13 comprises a PMOS device, and switch S14 comprises a CMOS device, although any other types of switches may also be used.

Figure 7:
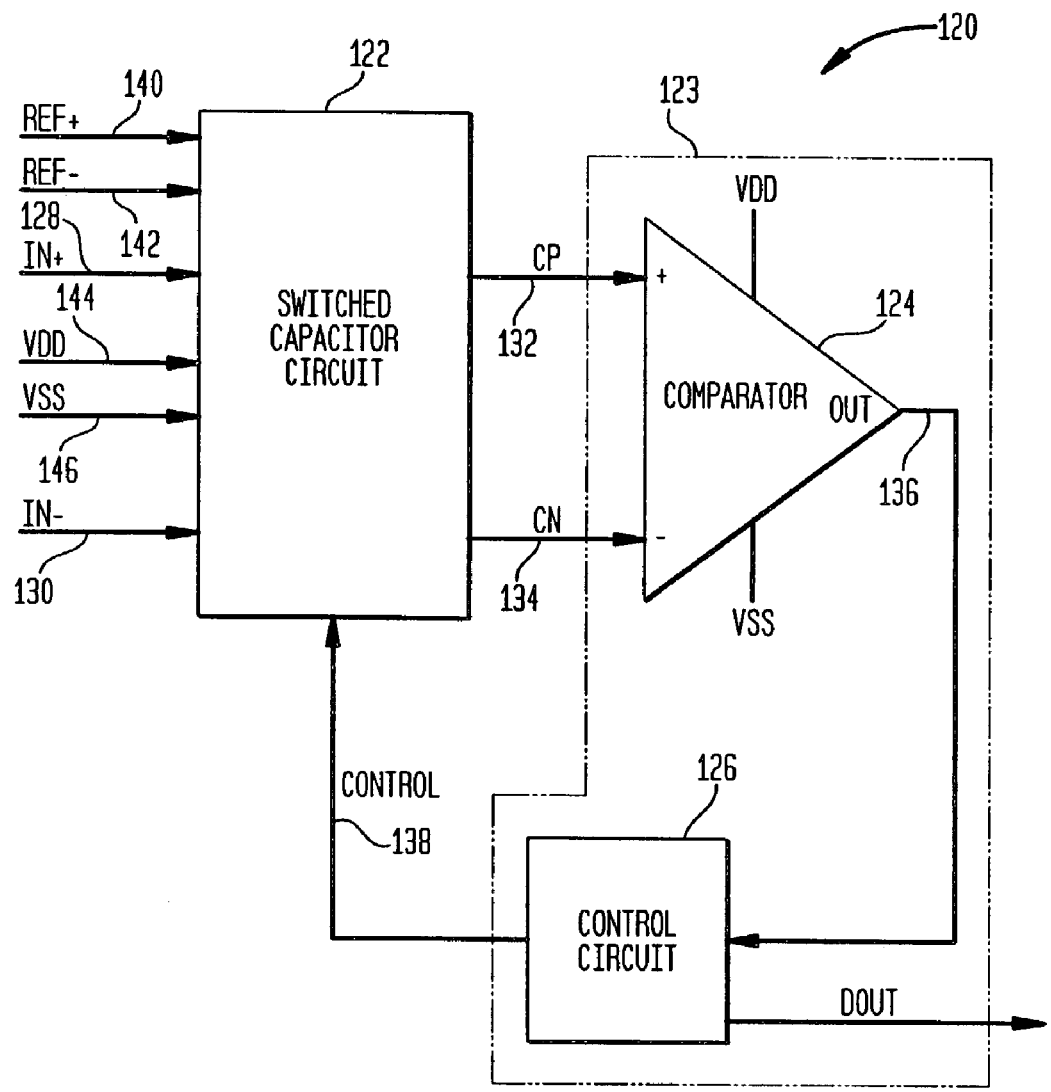
FIG. 7 is a block diagram of an ADC having a switched-capacitor circuit according to one embodiment of the present invention.

FIG. 7 is a block diagram of an ADC 120 having a switched-capacitor circuit according to one embodiment of the present invention. The ADC 120 includes two circuit portions 122, 123. The first circuit portion comprises a switched-capacitor circuit 122. The second circuit portion 123 comprises a comparator circuit 124 (referred to hereafter as comparator 124) and a control/output circuit 126 (referred to hereafter as control circuit 126). The switched-capacitor circuit 122 receives a differential input voltage, IN+, IN− (which is supplied via signal lines 128, 130, respectively), a differential reference voltage, REF+, REF− (which is supplied on signal lines 140, 142) and supply voltages VDD and VSS (which are supplied on signal lines 144, 146, respectively). The switched-capacitor circuit 122 generates a differential output voltage CP, CN, which is supplied on signal lines 132, 134, respectively, to the comparator 124. The output of the comparator 124 is supplied via a signal line 136 to the control circuit 126, which provides control signals (represented by CONTROL) that are supplied on signal lines (represented by a signal line 138) provided to the switched-capacitor circuit 122. The control circuit 126 also provides a multi-bit digital signal, DOUT, which is the output of the ADC 120. The DOUT signal indicates a ratio of the magnitude of the differential input signal, IN+, IN−, compared to the magnitude of the differential reference voltage, REF+, REF−.

Figure 8:
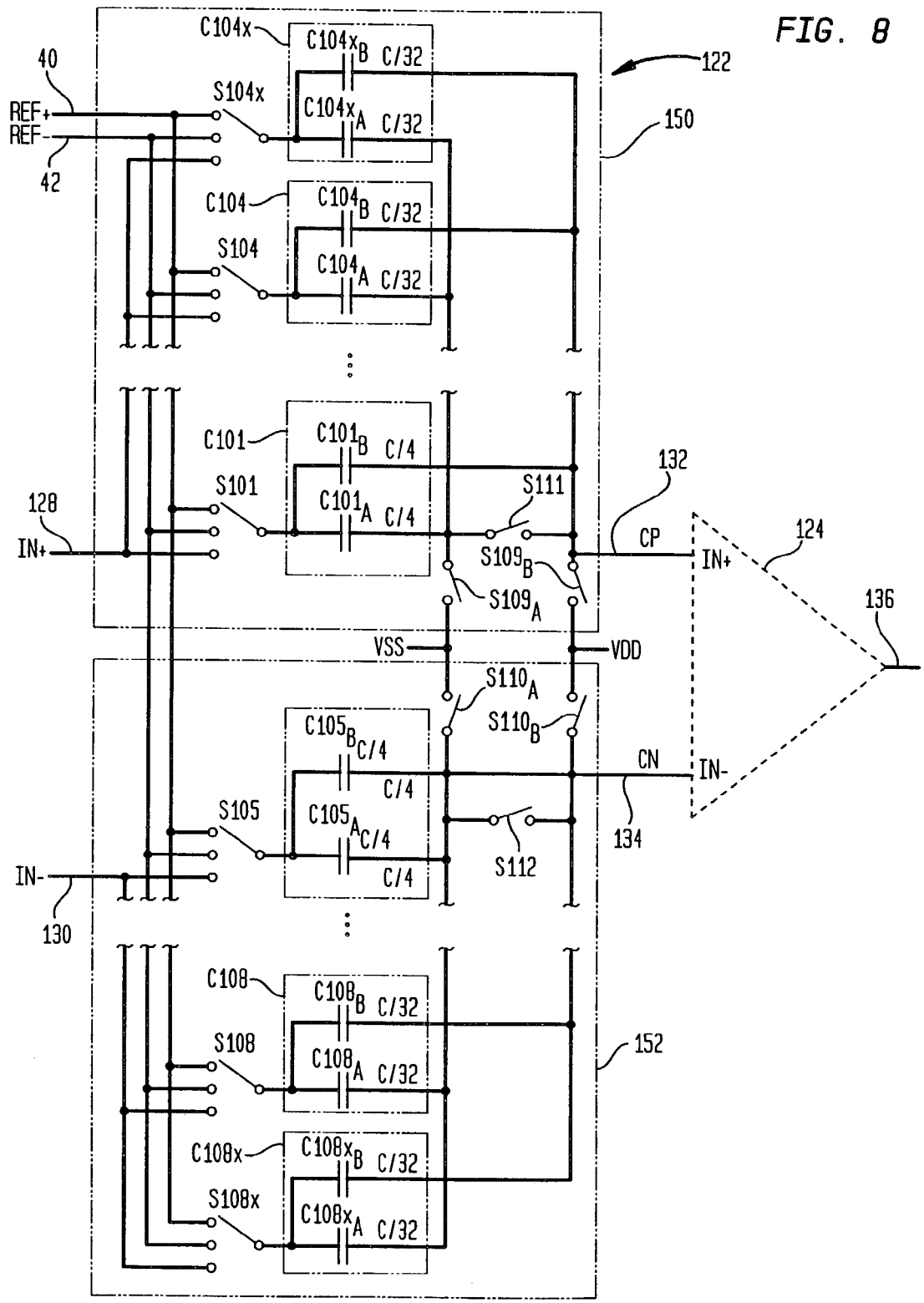
FIG. 8 is a schematic diagram of one embodiment of the switched-capacitor circuit of FIG. 7.

FIG. 8 is a schematic diagram of one embodiment of the switched-capacitor circuit 122. This embodiment of the switched-capacitor circuit 122 includes two circuit portions 150, 152. The first circuit portion 150 includes a plurality of capacitor banks C101–C104x and switches S101–S104x, S109A–S109B, S111. Each capacitor bank includes two capacitors. For example, capacitor bank C101 includes capacitors C101A, C101B. Capacitor bank C103 includes capacitors C103A, C103B. Capacitor bank C104 includes capacitors C104A, C104B.

The capacitance of each capacitor bank is equal to the sum of the capacitance values in that particular bank. For example, the capacitance of capacitor bank C101 is equal to C/2 (i.e., C/4+C/4). The capacitor banks C101–C104 may have binary-weighted capacitance values C/2, C/4, C/8, C/16 respectively, as shown, but are not limited to such. Additionally, capacitor bank C104x may have a capacitance value equal to C104, as shown, so that the sum capacitance of capacitor banks C102–C104x equals that of C101, but is not limited to such.

The second switched-capacitor circuit 152 includes capacitor banks C105–C108x and switches S105–S108x, S110A–S110B, S112. As with capacitor banks C101–104, each capacitor bank includes two capacitors. The capacitor banks C105–C108 may have binary-weighted capacitance values C/2, C/4, C/8, C/16 respectively, as shown, but are not limited to such. Additionally, capacitor bank C108x may have a capacitance value equal to C108, as shown, so that the sum capacitance of capacitor banks C106–C108x equals that of C105, but is not limited to such.

The switches in the switched-capacitor circuit 122 are controlled by the control signals, CONTROL, supplied from the control circuit 126.

The switches S101–S108x are identical to one another. Each has three operating states. For example, switch S101 connects the associated capacitor bank C101 to IN+, REF+, or REF−. Switch S105 connects the associated capacitor bank C105 to IN−, REF+, or REF−. And so on.

Figure 9:
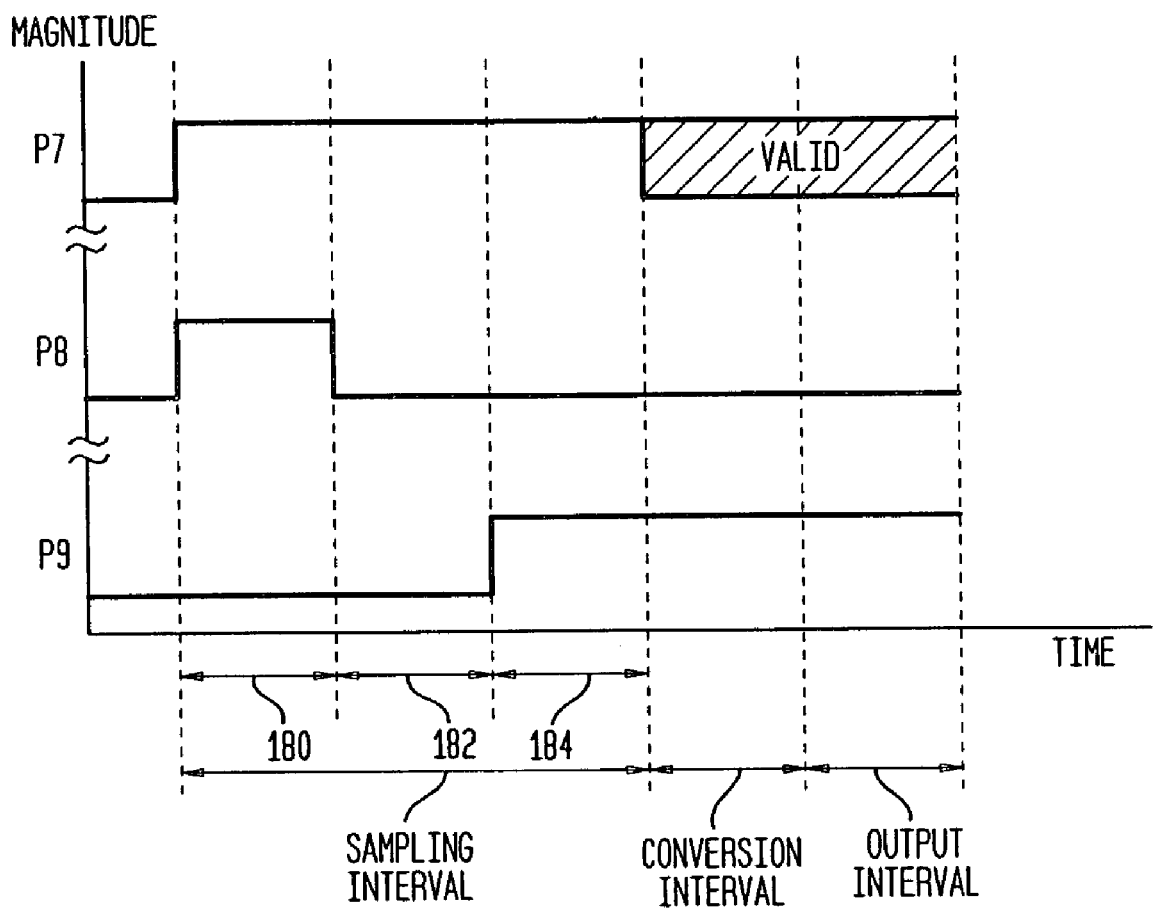
FIG. 9 illustrates timing signals used in one embodiment of the control circuit of FIG. 7.

FIG. 9 shows timing signals P7–P9 employed within the control circuit 126. Each of the timing signals P7–P9 has two logic states represented by first and second voltage levels. These timing signals are merely representative if those actually used; in particular, two state signals are used for convenience even when controlling a three state switch, and any ambiguity will be clear from explicit statement or the context of the use. The timing signals P7–P9 are shown on the same time axis however this does not signify that one attains different voltage levels than the others.

The operation is as follows. During a first portion of a sampling interval 180 (FIG. 9), switches S101–S104x are commanded to a state that connects each of the capacitors banks C101–C104x, respectively, to the voltage IN+. Switch S109A is commanded to a closed state thereby connecting the second plate of each of the capacitors C101A–C104xA to VSS. Switch S109B is commanded to a closed state thereby connecting the second plate of each of the capacitors C101B–C104xB to the voltage VDD. In this configuration, the voltage IN+ is sampled (with respect to voltage VSS) in each of the capacitors C101A–C104xA, and sampled (with respect to voltage VDD) in each of the capacitors C101B–C104xB. In addition, switches S105–S108x are commanded to a state that connects each of the capacitors banks C105–C108x, respectively, to the voltage IN−. Switch S110A is commanded to a closed state thereby connecting the second plate of each of the capacitors C105A–C108xA to VSS. Switch S110B is commanded to a closed state thereby connecting the second plate of each of the capacitors C105B–C108xB to the voltage VDD. With this configuration, the voltage IN− is sampled (with respect to voltage VSS) in each of the capacitors C105A–C108xA, and sampled (with respect to voltage VDD) in each of the capacitors C105B–C108xB.

During a second portion of the sampling interval 182 (FIG. 9), switches S109A–S110A, S109B–S110B are concurrently commanded to an open state, thereby disconnecting the second plate of the capacitors C101A–C108xA, C101B–C108xB, respectively, from the terminals supplying VSS and VDD.

During a third portion of the sampling interval 184 (FIG. 9), switch S111 is commanded to a closed state, thereby connecting the second plate of capacitors C101A–C104xA to the second plate of capacitors C101B–C104xB. In this configuration, the second plates of each of these capacitors C101A–C104xA, C101B–C104xB is equal to ½ (VDD+VSS) and the amount of charge stored by each of the capacitors C101A–C104xA, C101B–C104xB is equal to that which would have been stored by the capacitors C101A–C104xA, C101B–C104xB had the voltage IN+ been sampled with respect to ½ (VDD+VSS). In addition, switch S112 is commanded to a closed state, thereby connecting the second plate of capacitors C105A–C108xA to the second plate of capacitors C105B–C108xB. In this configuration, the second plates of each of these capacitors C105A–C108xA, C105B–C108xB is equal to ½ (VDD+VSS) and the amount of charge stored by each of the capacitors C105A–C108xA, C105B–C108xB is equal to that which would have been stored by the capacitors C105A–C108xA, C105B–C108xB had the voltage IN− been sampled with respect to ½ (VDD+VSS).

A conversion interval 186 (FIG. 9) follows the sampling interval. During the conversion interval 186, the control circuit 126 commands switches S101–S104x, S105–S108x to various states in accordance with a conversion algorithm, and monitors the resulting output signals from the comparator 124. Finally, during an output interval 188 (FIG. 9), the control circuit 126 provides a multi-bit digital output signal DOUT based on output signals received from the comparator 124 during the conversion interval 186 (FIG. 9). The multi-bit digital output may be in the form of parallel data, e.g., provided by way of plurality of signal lines, serial data, e.g., provided by way of a single signal line, or any combination thereof, e.g., some parallel data and some serial data.

Although each of the capacitor banks are shown having two capacitors, the capacitor banks may have any number of capacitors. Furthermore, the capacitors within a capacitor bank need not be identical to one another in value. Moreover, although the above embodiments show a voltage that is, in effect, sampled with respect to ½ (VDD+VSS), the present invention is not limited to such. For example, other embodiments may, in effect, sample a voltage with respect to any voltage or voltages.

Although the inputs of the comparator 124 are shown connected to the switched-capacitor circuit 122 during the sampling interval (FIG. 9), such connection during the sampling interval is not required. For example, in some embodiments, the inputs of the comparator 124 are disconnected from the switched-capacitor circuit during the sampling interval and may or may not be connected to another terminal (which may supply another voltage).

Figure 10:
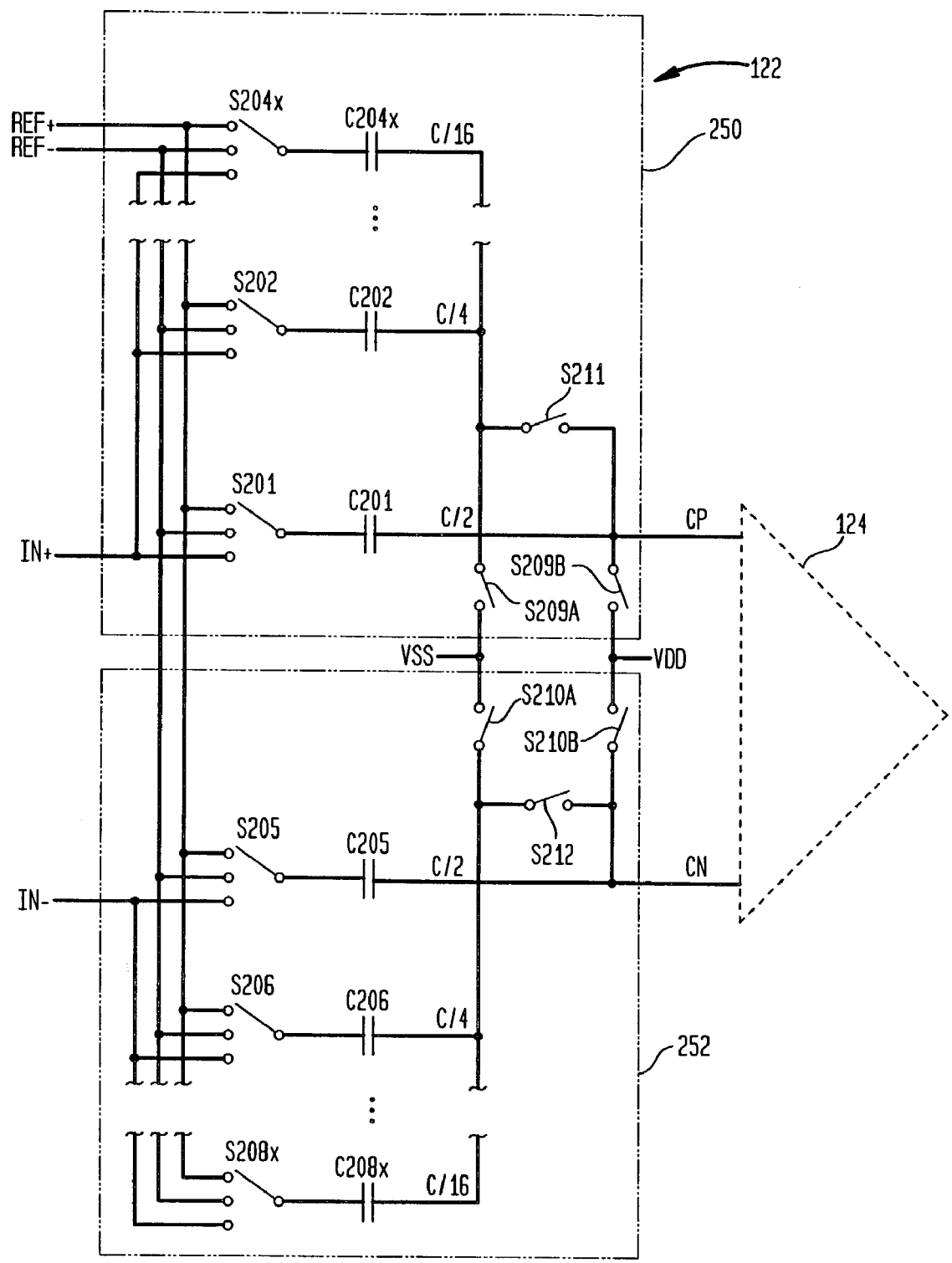
FIG. 10 is a schematic diagram of another embodiment of the switched-capacitor circuit of FIG. 7.

FIG. 10 is a schematic diagram of another embodiment of the switched-capacitor circuit 122. This embodiment of the switched-capacitor circuit 122 includes two circuit portions 250, 252. The first circuit portion 250 includes a plurality of capacitors C201–C204x and switches S201–S204x, S209A–S109B. The capacitors C201–C204 may have binary-weighted capacitance values C/2, C/4, C/8, C/16 respectively, as shown, but are not limited to such. Additionally, capacitor C204x may have a capacitance equal to that of C204, as shown, so that the sum capacitance of C202–C204x equals that of C201, but is not limited to such. The second circuit portion 252 includes a plurality of capacitors C205–C208x and switches S205–S208x, S210A–S210B. The capacitors C205–C208 may have binary-weighted capacitance values C/2, C/4, C/8, C/16 respectively, as shown, but are not limited to such. Additionally, capacitor C208x may have a capacitance equal to that of C208, as shown, so that the sum capacitance of C206–C208x equals that of C205, but is not limited to such The operation of this embodiment of the switched-capacitor circuit 122 is as follows. During a first portion of a sampling interval 180 (FIG. 9), switches S201–S204x are commanded to a state that connects each of the capacitors C201–C204x, respectively, of the first circuit portion 250 to the voltage IN+. Switch S209A is commanded to a closed state thereby connecting the second plate of each a first group of these capacitors, i.e., capacitors C202–C204x, to VSS. Switch S209B is commanded to a closed state thereby connecting the second plate of a second group of these capacitors, i.e., capacitor C201, to the voltage VDD. In this configuration, the voltage IN+ is sampled (with respect to voltage VSS) in each of the first group of capacitors, i.e., capacitors C202–C204x, and sampled (with respect to voltage VDD) in the second group of capacitors, i.e., capacitor C201. In addition, switches S205–S208x are commanded to a state that connects each of the capacitors C205–C208x, respectively, in the second circuit portion 252 to the voltage IN−. Switch S210A is commanded to a closed state thereby connecting the second plate of each a first group of these capacitors, i.e., C206–C208x, to VSS. Switch S210B is commanded to a closed state thereby connecting the second plate of a second group of these capacitors, i.e., C205, to the voltage VDD. In this configuration, the voltage IN− is sampled (with respect to voltage VSS) in each of the capacitors C206–C208x, and sampled (with respect to voltage VDD) in capacitor C205.

During a second portion of a sampling interval 182 (FIG. 9), switches S209A–S210A, S209B–S210B are concurrently commanded to an open state, thereby disconnecting the second plate of the capacitors C201–C208x, from the terminals supplying VSS and VDD.

During a third portion of a sampling interval 184 (FIG. 9), switch S211 is commanded to a closed state, thereby connecting the second plate of capacitor C201 to the second plate of capacitors C202–C204*x*. In this configuration, the second plates of each of these capacitors C201–C204*x* is equal to ½ (VDD+VSS) and the amount of charge stored by each of the capacitors C201–C204*x* is equal to that which would have been stored by the capacitors C201–C204*x* had the voltage IN+ been sampled with respect to ½ (VDD+VSS). In addition, switch S212 is commanded to a closed state, thereby connecting the second plate of capacitor C205 to the second plate of capacitors C206–C208*x*. In this configuration, the second plates of each of these capacitors C205C208*x* is equal to ½ (VDD+VSS) and the amount of charge stored by each of the capacitors C205–C208*x* is equal to that which would have been stored by the capacitors C205–C208*x* had the voltage IN– been sampled with respect to ½ (VDD+VSS).

Figure 11:
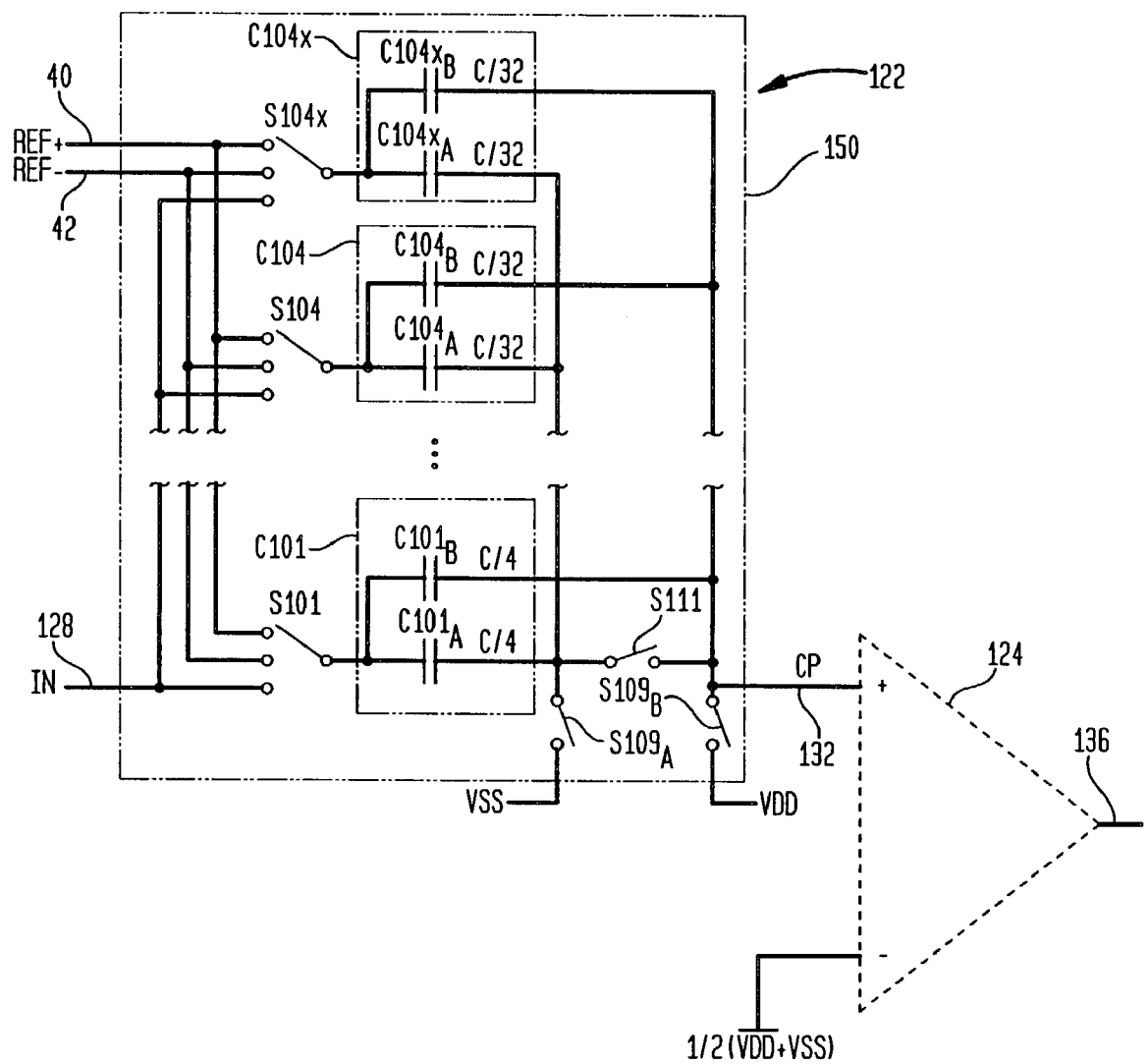
FIG. 11 is a schematic diagram of another embodiment of the switched-capacitor circuit of FIG. 7.
Figure 12:
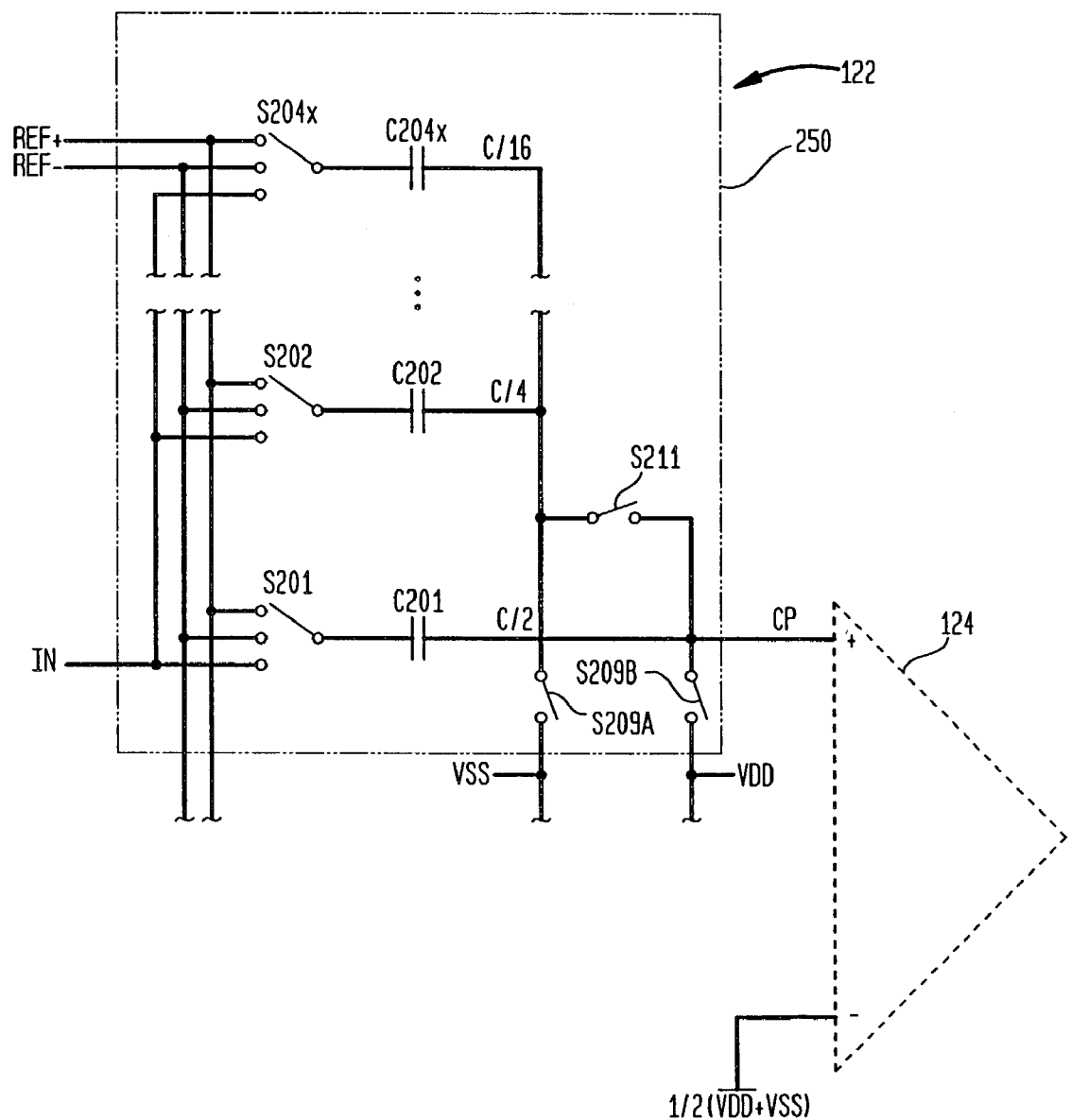
FIG. 12 is a schematic diagram of another embodiment of the switched-capacitor circuit of FIG. 7.

Although the various embodiments of the switched-capacitor circuit 122 shown above each have a differential configuration, the present invention is not limited to such. Thus, some embodiments may employ a single-ended configuration. For example, FIGS. 11, 12 show further embodiments of the switched-capacitor circuit of FIG. 7. The embodiment of FIG. 11 is identical to the embodiment of FIG. 8, except that the embodiment of FIG. 11 is a single-ended configuration, to receive a single-ended input, IN. The embodiment of FIG. 12 is identical to the embodiment of FIG. 10, except that the embodiment of FIG. 12 is a single-ended configuration, to receive a single-ended input, IN.

The term "switch" as used herein is defined as any type of switch. A switch may comprise a one or more elements that function as a switch. For example, a switch may include but is not limited to one or more active elements (for example one or more transistors) and may but need not employ MOS technology.

The term "capacitor" as used herein is defined as any type of capacitor. A capacitor may comprise one or more elements that provide capacitance. For example, a capacitor may include but is not limited to metal, polysilicon and double polysilicon, metal metal, metal poly, poly diffusion, semiconductors, junction capacitors, parallel plate technology, adjacent conductors, fringing capacitors, and/or any combination thereof.

Although the capacitor banks described above have binary-weighted capacitance values, this is not a requirement. For example, some embodiments may have four capacitor banks with equally-weighted capacitance values, e.g., C/4, C/4, C/4, C/4.

Furthermore, although the DOUT signal described above indicates a ratio of the magnitude of the differential input signal, IN+, IN–, compared to the magnitude of the differential reference voltage, REF+, REF–, ADCs are not limited to such. For example, an DOUT signal may simply represent a value that is related to, e.g., proportional to, the magnitude of the input signal.

In addition, it should be understood that although various embodiments above show a switched-capacitor circuit supplying one or more signals to the comparator 124 (which is a type of amplifier), the switched-capacitor circuits described herein are also useful in association with other types of circuits, e.g., non-comparator type amplifiers. For example, in some embodiments, a switched-capacitor circuit supplies one or more signal(s) to one or more non-comparator type amplifier(s).

Moreover, although the embodiments of the switched-capacitor circuits 122 shown in FIGS. 8, 10 are suitable for a 4-bit ADC, these embodiments are merely illustrative. The present invention is not limited to 4-bit ADCs. Indeed, as stated above, switched-capacitor techniques are used in many systems. Thus, the switched-capacitor circuits and techniques described above are not limited to successive approximation ADCs, or even ADCs in general, but rather may be used in any type of system.

Note that, except where otherwise stated, terms such as, for example, "comprises", "has", "includes" and all forms thereof, are considered open-ended so as not to precluded additional elements and/or features.

Also note, except where otherwise stated, phrase such as, for examples, "in response to", "based on" and "in accordance with" mean "in response at least to", "based at least on" and "in accordance with at least", respectively, so as to not preclude being responsive to, based on, or in accordance with more than one thing.

Moreover, except where otherwise stated, "connect to" means "connect directly to" or "connect indirectly to". Further, although the capacitors C10A, C10B are shown connected directly to one another (neglecting switch S14), the present invention is not limited to direct connections. For example, in other embodiments, there may be resistance(s) and/or one or more switches, in series with the capacitors C10A, C10B, such as for example, but not limited to, as shown in FIG. 13, which is a schematic diagram of another embodiment 280 of a switched capacitor circuit. The embodiment of FIG. 13 is identical to the embodiment of FIG. 5, except that the embodiment of FIG. 13 further includes resistors R200, R201 and replaces switch S11 with two switches S211A, S211B. As with switch S11, switches S211A, S211B, may for example, be commanded to a closed state during the first sampling interval and they may remain in the closed state during the second and third sampling intervals.

While there have been shown and described various embodiments, it will be understood by those skilled in the art that the present invention is not limited to such embodiments, which have been presented by way of example only, and that various changes and modifications may be made without departing from the spirit and scope of the invention. Accordingly, the invention is limited only by the appended claims and equivalents thereto.

What is claimed is:

1. A system comprising:
a switched-capacitor circuit including a first capacitor, a second capacitor, and at least one switch, the at least one switch being operable during a first time interval to connect the first capacitor between a first signal line having a first voltage and a second signal line having a second voltage, and connect the second capacitor between the first signal line having the first voltage and a third signal line having a third voltage, the third voltage being different than the second voltage, wherein the first capacitor samples the first voltage with respect to the second voltage and the second capacitor samples the first voltage with respect to the third voltage, and the at least one switch being operable during a second time interval to disconnect the first and second capacitor from the second and third signal lines respectively, and connect the first capacitor in parallel with the second capacitor.

2. The system of claim 1 wherein during the second interval, the voltage across the first capacitor and the voltage across the second capacitor become equal to one another.

3. The system of claim 1 wherein the at least one switch comprises a switch network operable to connect the first capacitor and the second capacitor to a voltage selected from a group including the first voltage, a first reference voltage and a second reference voltage.

4. The system of claim 1 wherein the first capacitor has a first capacitance value and the second capacitor has a second capacitance value, the first capacitance value being substantially equal to the second capacitance value.

5. The system of claim 1 wherein the first capacitor and second capacitor are configured to be connected in parallel to a second circuit further having one or more output lines to supply a multi-bit digital signal representing a value proportional to a signal of the first signal line.

6. The system of claim 1 wherein the switched-capacitor circuit has an output line to supply an output signal, and wherein the system further comprises an amplifier having an input line coupled to the output line of the switched-capacitor circuit.

7. The system of claim 1 wherein the switched-capacitor circuit has an output line to supply an output signal, and wherein the system further comprises:
   a comparator having an input line coupled to the output line of the switched-capacitor circuit, and further having an output line to supply an output signal; and
   a control circuit having an input line coupled to the output line of the comparator, and further having at least one output line coupled to the switched-capacitor network to supply at least one control signal to the at least one switch of the switched-capacitor circuit, the control circuit further having one or more output lines to supply a multi-bit digital signal.

8. The system of claim 7 wherein the first capacitor and the second capacitor are both connected to the output line of the switched-capacitor circuit in at least one operating state.

9. The system of claim 7 wherein the multi-bit digital signal supplied by the control circuit comprises a multi-bit signal that is representative of the first voltage.

10. The system of claim 7 wherein the multi-bit digital signal supplied by the control circuit indicates a ratio of the magnitude of the first signal to the magnitude of a reference voltage.

11. The system of claim 7 wherein the multi-bit digital signal supplied by the control circuit comprises a multi-bit digital signal generated in response to the output signal of the comparator during a conversion interval.

12. The system of claim 7 wherein the at least one control signal supplied by the control circuit comprises at least one control signal generated in response to the output signal received from the comparator during a conversion interval.

13. The system of claim 7 wherein the comparator has a first power supply terminal and a second power supply terminal, the first power supply terminal receives a voltage substantially equal to the second voltage and the second power supply terminal receives a voltage substantially equal to the third voltage.

14. The system of claim 1 wherein the first capacitor has a first plate and a second plate, the second capacitor has a first plate and a second plate, and the at least one switch comprises at least one switch being operable during the first interval to (1a) connect the first plate of the first capacitor to the first signal line having the first voltage, (1b) connect the second plate of the first capacitor to the second signal line having the second voltage, (2a) connect the first plate of the second capacitor to the first signal line having the first voltage and (2b) connect the second plate of the first capacitor to the third signal line having the third voltage, and the at least one switch being operable during the second interval to connect the second plate of the first capacitor to the second plate of the second capacitor.

15. The system of claim 14 wherein the at least one switch comprises:
   a first switch operable during the first interval to connect the second plate of the first capacitor to the second signal line and operable during the second interval to disconnect the second plate of the first capacitor from the second signal line;
   a second switch operable during the first interval to connect the second plate of the second capacitor to the third signal line and operable during the second interval to disconnect the second plate of the second capacitor from the third signal line; and
   a third switch operable during the first interval to disconnect the second plate of the first capacitor from the second plate of the second capacitor signal line and operable during the second interval to connect the second plate of the first capacitor to the second plate of the second capacitor.

16. A system comprising:
   a switched-capacitor circuit having a plurality of banks of capacitors and at least one switch, each of the plurality of banks of capacitors having a first capacitor and a second capacitor, the at least one switch being operable during a first time interval to connect the first capacitor of each bank between a first signal line having a first voltage and a second signal line having a second voltage, and connect the second capacitor of each bank between the first signal line having the first voltage and a third signal line having a third voltage, the third voltage being different than the second voltage, wherein the first capacitor samples the first voltage with respect to the second voltage and the second capacitor samples the first voltage with respect to the third voltage, and the at least one switch being operable during a second time interval to disconnect the first and second capacitors of each bank from the second and third signal lines respectively, and connect the first capacitor of each bank in parallel with the second capacitor of such bank.

17. The system of claim 16 wherein the switched-capacitor circuit has an output line to supply an output signal, and wherein the system further comprises a second circuit having an input line coupled to the output line of the switched-capacitor circuit, and the second circuit further having one or more output lines to supply a multi-bit digital signal representing a value proportional to the first signal.

18. The system of claim 16 wherein the switched-capacitor circuit has an output line to supply an output signal, and wherein the system further comprises an amplifier having an input line coupled to the output line of the switched-capacitor circuit.

19. The system of claim 16 wherein the switched-capacitor circuit has an output line to supply an output signal, and wherein the system further comprises:
   a comparator having an input line coupled to the output line of the switched-capacitor circuit, and further having an output line to supply an output signal; and
   a control circuit having an input line coupled to the output line of the comparator, and further having at least one output line coupled to the switched-capacitor network to supply at least one control signal to the switched-capacitor network, the control circuit further having one or more output lines to supply a multi-bit digital signal.

20. The system of claim 19 wherein the first capacitor and the second capacitor of each of the plurality of banks of capacitors are all connected to the output line of the switched-capacitor circuit in at least one operating state.

21. The system of claim 19 wherein the multi-bit digital signal supplied by the control circuit comprises a multi-bit signal that is representative of the first voltage.

22. The system of claim 19 wherein the multi-bit digital signal supplied by the control circuit indicates a ratio of the magnitude of the first signal to the magnitude of a reference voltage.

23. The system of claim 19 wherein the multi-bit digital signal supplied by the control circuit comprises a multi-bit digital signal generated in response to the output signal of the comparator during a conversion interval.

24. The system of claim 19 wherein the at least one control signal supplied by the control circuit comprises at least one control signal generated in response to the output signal received from the comparator during a conversion interval.

25. The system of claim 19 wherein the comparator has a first power supply terminal and a second power supply terminal, the first power supply terminal receives a voltage substantially equal to the second voltage and the second power supply terminal receives a voltage substantially equal to the third voltage.

26. A system comprising:
a switched-capacitor circuit having a first group of capacitors, a second group of capacitors, and at least one switch, the first group of capacitors having at least one capacitor, the second group of capacitors having at least one capacitor, the at least one switch being operable during a first time interval to connect each capacitor of the first group of capacitors between a first signal line having a first voltage and a second signal line having a second voltage, and connect each capacitor of the second group of capacitors between the first signal line having the first voltage and a third signal line having a third voltage, the third voltage being different than the second voltage, wherein each capacitor of the first group of capacitors samples the first voltage with respect to the second voltage and each capacitor of the second group of capacitors samples the first voltage with respect to the third voltage, and the at least one switch being operable during a second time interval to disconnect each of the capacitors of the first and second group from the second and third signal lines respectively, and connect each capacitor of the first group of capacitors in parallel with each capacitor of the second group of capacitors.

27. The system of claim 24 wherein the switched-capacitor circuit has an output line to supply an output signal, and wherein the system further comprises a second circuit having an input line coupled to the output line of the switched-capacitor circuit, and the second circuit further having one or more output lines to supply a multi-bit digital signal representing a value representative of the first signal.

28. The system of claim 26 wherein the switched-capacitor circuit has an output line to supply an output signal, and wherein the system further comprises an amplifier having an input line coupled to the output line of the switched-capacitor circuit.

29. The system of claim 26 wherein the switched-capacitor circuit has an output line to supply an output signal, and wherein the system further comprises:

a comparator having an input line coupled to the output line of the switched-capacitor circuit, and further having an output line to supply an output signal; and
a control circuit having an input line coupled to the output line of the comparator, and further having at least one output line coupled to the switched-capacitor network to supply at least one control signal to the switched-capacitor circuit, the control circuit further having one or more output lines to supply a multi-bit digital signal.

30. The system of claim 29 wherein each capacitor of the first group of capacitors and each capacitor of the second group of capacitors is connected to the output line of the switched-capacitor circuit in at least one operating state.

31. The system of claim 29 wherein the multi-bit digital signal supplied by the control circuit comprises a multi-bit signal that is representative of the first voltage.

32. The system of claim 29 wherein the multi-bit digital signal supplied by the control circuit indicates a ratio of the magnitude of the first voltage to the magnitude of a reference voltage.

33. The system of claim 29 wherein the multi-bit digital signal supplied by the control circuit comprises a multi-bit digital signal generated in response to the output signal of the comparator during a conversion interval.

34. The system of claim 29 wherein the at least one control signal supplied by the control circuit comprises at least one control signal generated in response to the output signal received from the comparator during a conversion interval.

35. The system of claim 29 wherein the comparator has a first power supply terminal and a second power supply terminal, the first power supply terminal receives a voltage substantially equal to the second voltage and the second power supply terminal receives a voltage substantially equal to the third voltage.

36. A system comprising:
a switched-capacitor circuit having a first group of capacitors, a second group of capacitors, and at least one switch, the first group of capacitors having at least one capacitor, the second group of capacitors having at least one capacitor, the at least one switch being operable during a first time interval to connect at least one capacitor of the first group of capacitors between a first signal line having a first voltage and a second signal line having a second voltage, and connect at least one capacitor of the second group of capacitors between the first signal line having the first voltage and a third signal line having a third voltage, the third voltage being different than the second voltage, wherein the at least one capacitor of the first group of capacitors samples the first voltage with respect to the second voltage and the at least one capacitor of the second group of capacitors samples the first voltage with respect to the third voltage, and the at least one switch being operable during a second time interval to disconnect the at least one capacitor of the first group and the at least one capacitor of the second group from the second and third signal lines respectively, and connect the at least one capacitor of the first group to the at least one capacitor of the second group such that the voltage across the at least one capacitor of the first group and the voltage across the at least one capacitor of the second group become equal to one another.

37. The system of claim 36 wherein the at least one switch is further operable to disconnect the at least one capacitor of the first group from the second signal line having the second voltage, and disconnect the at least one capacitor of the second group from the third signal line having the third voltage, prior to connecting the at least one capacitor of the first group to the at least one capacitor of the second group.

38. A method comprising:
connecting, during a first time interval, a first capacitor between a first signal line having a first voltage and a second signal line having a second voltage, a second capacitor between the first signal line and a third signal line having a third voltage, the third voltage being different than the second voltage;
sampling, during the first time interval, the first voltage with respect to the second voltage using the first capacitor, and sampling, during the first time interval, the first voltage with respect to the third voltage using the second capacitor;
disconnecting, during a second time interval, the first and second capacitor from the second and third signal lines respectively; and
connecting, during a third time interval, the first capacitor in parallel with the second capacitor.

39. A system comprising:
means for connecting, during a first interval, a first capacitor between a first signal line having a first voltage and a second signal line having a second voltage such that the first capacitor samples the first voltage with respect to the second voltage, and for connecting, during the first interval, a second capacitor between the first signal line having the first voltage and a third signal line having a third voltage such that the second capacitor samples the first voltage with respect to the third voltage, the third voltage being different than the second voltage;
means for disconnecting, during a second interval, the first and second capacitor from the second and third signal lines respectively; and
means for connecting, during a third interval, the first capacitor in parallel with the second capacitor.

40. A method of sampling an analog input signal onto a switched-capacitor circuit with respect to a first voltage without requiring the first voltage to be present, the method comprising:
sampling the input signal onto a first capacitor with respect to second voltage;
sampling the input signal onto a second capacitor with respect to a third voltage;
disconnecting the second and third voltages from the first and second capacitors respectively so that the first and second capacitors each have a floating capacitor plate; and
connecting the floating capacitor plates of the first and second capacitors to each other to create a sample of the input signal with respect to the first voltage which is a fixed combination of the second and third voltages.

41. The method of claim 40, wherein the first and second capacitors have equal capacitances and the second and third voltages are external supply voltages, Vdd and Vss respectively, and the sample of the input signal with respect to the first voltage is a sample with respect to (Vdd+Vss)/2.

42. The method of claim 40, wherein the first and second capacitors have equal capacitances and the second and third voltages are external reference voltages, REF+ and REF− respectively, and the sample of the input signal with respect to the first voltage is a sample with respect to (REF++REF−)/2.

43. A method of sampling an analog input signal onto a switched-capacitor circuit with respect to a first voltage without requiring the first voltage to be present, the method comprising:
sampling the input signal onto each of a plurality of capacitors, each capacitor sampling the input signal with respect to one of a plurality of reference voltages;
disconnecting the each of the plurality of capacitors from its respective reference voltage so that each of the plurality of capacitors has a floating capacitor plate; and
connecting the floating capacitor plates of a group of capacitors from the plurality of capacitors to create a final input sample of the input signal with respect to the first voltage, which is a sum over all of the capacitors in the group whose floating capacitor plates are connected of a product of the respective reference voltage of each capacitor and that capacitor's capacitance, divided by the total capacitance of the group of capacitors.

44. A method of sampling an arbitrary input voltage onto an input capacitor array of an analog to digital converter with respect to a first voltage not present in the converter, the method comprising:
dividing the input capacitor array into first and second sub-arrays;
sampling the input voltage with respect to a second voltage on the first sub-array;
sampling the input voltage with respect to a third voltage on the second sub-array;
disconnecting the first and second sub-arrays from the second and third voltages respectively to create a floating node for the first sub-array and a floating node for the second sub-array; and
connecting the floating node of the first sub-array to the floating node of the second sub-array to create a single array and a new sample wherein the input voltage is virtually sampled with respect to the first voltage which is a fixed combination of the second and third voltages.

45. The method of claim 44, wherein the first and second capacitor sub-arrays are of equal capacitance value and the second and third voltages are the external supplies, Vdd and Vss respectively, and the new sample is a sample with respect to (Vdd+Vss)/2.

46. A method of sampling an arbitrary input signal onto an input capacitor array of an analog to digital converter with respect to a first voltage that does not exist in the converter, wherein the input capacitor array consists of a plurality of capacitor banks, each capacitor bank comprising at least two capacitors, the method comprising:
sampling the input signal with respect to a second voltage on a first of the at least two capacitors of each capacitor bank;
sampling the input signal with respect to a third voltage on a second of the at least two capacitors of each capacitor bank;
disconnecting the second and third voltages from all the capacitors of each capacitor bank to create a floating capacitor plate for each capacitor in the capacitor bank; and
connecting all the floating capacitor terminals in each bank together to form at least two capacitors connected in parallel in each capacitor bank which form a new sample wherein the input signal is virtually sampled with respect to the first voltage which is a fixed combination of the second and third voltages.

47. The method of claim 46, wherein each of the plurality of capacitor banks has two capacitors having substantially the same capacitance and the second and third voltages are external supply voltages, Vdd and Vss respectively, and wherein the new sample is a sample of the input signal with respect to (Vdd+Vss)/2.

48. A charge redistribution analog to digital converter comprising:
- a comparator having first and second comparator inputs;
- a switched capacitor circuit arranged to be connected to the first and second comparator inputs;
- a control circuit to control an analog to digital conversion and deliver a digital output; wherein the switched capacitor circuit further comprises:
- a first and a second capacitor array each having a plurality of bottom plates and a first and a second top plate, the first top plate of the first capacitor array arranged to be connected to the first comparator input and the first top plate of the second capacitor array arranged to be connected to the second comparator input;
- at least one switch device arranged to connect the bottom plates of each capacitor array to an analog input signal;
- at least one switch device arranged to connect the first top plate and the second top plate of each capacitor array to one of at least two reference voltages which the analog input signal is sampled with respect to;
- at least one switch device arranged to connect the first top plate and the second top plate of each capacitor array together.

49. The analog to digital converter of claim 48, wherein the first and second capacitor array each have a first capacitor and a second capacitor.

50. The analog to digital converter of claim 49, where the first capacitor and the second capacitor of each capacitor array have substantially the same capacitance and are arranged to be connected through the second switch device to a first and a second reference voltage, respectively, of the at least two reference voltages, where the first and second reference voltage are Vdd and Vss respectively, such that the input signal is able to be sampled with respect to (Vdd+Vss)/2.

51. The system of claim 15, wherein the at least one switch further comprises:
- at least one switch operable during the first interval to connect the first plate of the first capacitor to the first signal line and to connect the first plate of the second capacitor to the first signal line.

* * * * *